United States Patent [19]

Schulz-Harder

[11] Patent Number: 5,527,620
[45] Date of Patent: Jun. 18, 1996

[54] METAL COATED SUBSTRATE HAVING IMPROVED RESISTIVITY TO CYCLIC TEMPERATURE STRESS

[76] Inventor: Jurgen Schulz-Harder, Hugo-Dietz-Strasse 32, D-91207 Lauf, Germany

[21] Appl. No.: 253,247

[22] Filed: Jun. 2, 1994

[30] Foreign Application Priority Data

Jun. 2, 1993 [DE] Germany .......................... 43 18 241.0

[51] Int. Cl.⁶ ..................................................... B32B 9/00
[52] U.S. Cl. .......................... 428/457; 428/209; 428/210; 428/212; 428/220; 428/328; 428/336; 428/352; 428/375; 428/379; 428/388; 428/389; 428/403; 428/432; 428/433; 428/469; 428/901
[58] Field of Search ..................................... 428/357, 375, 428/379, 388, 389, 403, 209, 210, 336, 432, 433, 457, 469, 901, 328, 212, 220

[56] References Cited

U.S. PATENT DOCUMENTS 4,997,698  3/1991  Oboodi et al. ............................ 428/209
5,063,121  11/1991  Sato et al. ................................. 428/698
5,156,725  10/1992  Doktycz et al. ..................... 204/192.16
5,173,354  12/1992  Raj ............................................ 428/209

FOREIGN PATENT DOCUMENTS 4004844  3/1991  Germany .

Primary Examiner—Patrick J. Ryan
Assistant Examiner—Abraham Bahta
Attorney, Agent, or Firm—Hoffman, Wasson & Gitler

[57] ABSTRACT

A metal coated substrate with improved resistivity to cyclic temperature stress is provided. A metal layers is attached to an insulating layer having a thickness of 0.2 mm. The metal layer is formed in a border area and is weakened by openings disposed in two rows. The depth of the openings nearer the border are greater than the depth of the openings in the tow farther from the border. The distance between the bottoms of the openings in the first row and the insulating layer is less than ⅓ of the thickness of the metal layer, and the distance between the bottom of the second row of openings and the surface of the insulating layer is ⅓ to ½ the thickness of the metal layer.

10 Claims, 2 Drawing Sheets

METAL COATED SUBSTRATE HAVING IMPROVED RESISTIVITY TO CYCLIC TEMPERATURE STRESS

FIELD OF THE INVENTION

The invention relates to a substrate with improved resistivity to cyclic temperature stress.

BACKGROUND OF THE INVENTION

In particular also ceramic substrates are known in the most varied versions and are used preferably for electrical power circuits or modules.

In many applications these ceramic substrates are subject to high cyclic temperature loads in which temperature changes in the range between −40° C. and +125° C. can occur throughout.

Due to the different coefficients of thermal expansion of the ceramic layer and metal layer, on the transition between these layers during temperature fluctuations considerable mechanical compressive or tensile stresses occur with a gradient in the ceramic material on the border of the metal layer which is especially large and which leads to cracks in the ceramic layer.

It is known that by structuring of the metal layer, which (the structuring) is very often already dictated by the layout necessary for the circuit, the gradient of tensile and compressive stresses can be reduced.

It has already been suggested (DE 40 04 844) that a structured metal coating be formed by etching techniques, which is weakened in places on its borders to reduce the gradient of tensile and compressive stresses. The teaching imparted in this regard also comprises in its generally held form already known configurations of printed conductors, contact surfaces or similar structured metal coatings and also border weakening as is inevitably obtained in etching of structures of metal coatings and as cannot be avoided.

SUMMARY OF THE INVENTION

The problem of the invention is to devise a ceramic substrate which is characterized by improved service life and in which even at great thickness of the metal layer cracks on the border of this layer itself in a large number of cyclic temperature loads are in particular effectively prevented.

To solve this problem a ceramic substrate having a metal layer attached to an insulating layer with a thickness of 0.2 mm is formed. The metal layer is formed on a border area and is weakened by openings. The openings are disposed in two rows with the depth of the openings in the row nearer the border being greater than the depth of the openings in the first row and the insulating layer is less than ⅓ of the thickness of the metal layer and the distance between the bottoms of the second row and the surface of the insulating layer is between ⅓ and ½ the thickness of the metal layer.

By means of the configuration according to the invention, i.e., by special weakening of the metal layer in the area of its border by two rows of openings, an especially favorable distribution of compressive and tensile stresses is achieved so that even with very thick metal layers, i.e., for metal layers with a thickness of at least 0.2 mm, but preferably greater, and for a large number of cyclic temperature loads cracks caused by compressive and tensile stresses are effectively prevented.

BRIEF DESCRIPTION OF THE DRAWINGS

The invention is detailed below on examples of embodiments using figures.

DETAIL DESCRIPTION OF THE PREFERRED EMBODIMENTS

Figure 1:
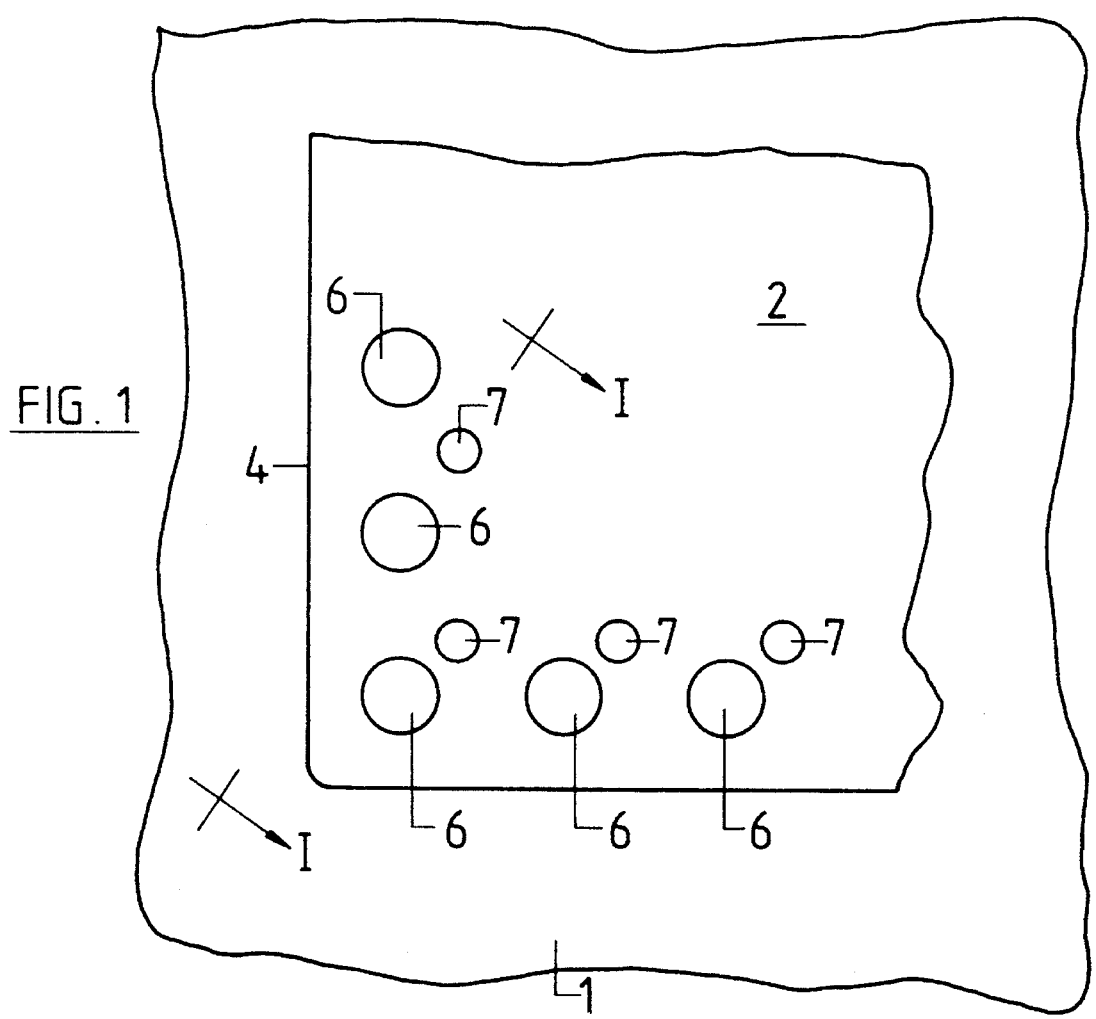
FIG. 1 shows in a partial representation and in an overhead view a ceramic substrate according to the invention.

FIG. 1 shows part of a ceramic substrate which consists essentially of ceramic layer 1, for example of an aluminum oxide ceramic or an aluminum nitride ceramic, as well as of metal layers 2 and 3, for example, copper layers, of which metal layer 2 is provided on the top and metal layer 3 is on the bottom of ceramic layer 1.

At least metal layer 2 has a thickness of at least 0.2 mm. Both metal layers are each joined flat to one surface side of ceramic layer 1, for example, by means of the DCB process or active brazing process repeatedly described in the literature and known to one skilled in the art.

The ceramic substrate is part of an electrical power circuit or module. Upper metal layer 2 is structured using known techniques (for example, etching techniques) and forms printed conductors as well as metal coated contact surfaces on which the power components not shown are attached, with heat loss which is dissipated via metal layer 2, ceramic layer 1, and other metal layer 3 to a heat sink not shown.

In many applications, for example also in motor vehicle electronics, ceramic substrates are subject to major cyclic temperature loads in which temperature fluctuations can be between −60° C. and +125° C. Especially when metal coating 2 has a thickness which is greater than 0.2 mm, in order to be able to implement printed conductors which ensure a cross section adequate for the high currents of a power module, along border 4 of metal layer 2 or the structures formed by it in the area of the surface of ceramic layer 1 cracks 5 and thus detachment of metal layer 2 can occur. These cracks 5 can be attributed to the fact that during cooling or heating of the substrate, caused by the different coefficients of thermal expansion of the metal of metal layer 2 and the ceramic of ceramic layer 1, on the transition between metal layer 2 and ceramic layer 1 mechanical compressive and tensile stresses occur, the gradient of the diffusion of stress, therefore the change of the respective compressive and tensile stress on border 4 being especially great.

In order to reduce these gradients on the transition from metal layer 2 to ceramic layer 1, especially also in the area of border 4, in metal layer 2 along border 4 several openings 6 and 7 are made in two rows, of which openings 6 form the first row nearer border 4 and openings 7 form the second row farther away from border 4.

Openings 6 and 7, which each have the same cross section in the embodiment shown, from the top of metal layer 2 facing away from ceramic layer 1 are made in metal layer 2 with suitable, known techniques, for example, with etching techniques, such that openings 6 are either entirely continuous, i.e., the bottom of these openings are formed by the top of ceramic layer 1, or between the bottom of openings 6 and the top of ceramic layer 1 a distance remains which corresponds to roughly one third of the thickness of metal layer 2.

Openings 7 have a depth which is less compared to openings 6 and are produced so far into metal layer 2 that the distance between the bottom of these openings and the top of ceramic layer 1 lies roughly in the range between one third of the thickness of metal layer 2 and half of this thickness.

The distance of openings 6 and 7 is roughly between half and 3 times the radius of these openings. The diameter of openings 6 and 7 is in the range between 0.5 and 2.5 times the thickness of the metal layer. In this case overlapping of openings 6 and 7 is possible.

In the embodiment shown openings 6 and 7 are furthermore offset to gaps such that along the rows there is one opening 7 each between two openings 6. The two rows of openings 6 and 7 are provided in a strip-shaped area along border 4 with a width which is at most 2 mm.

Openings 6 and 7 yield a significant reduction of the gradient of compressive and tensile stresses between ceramic layer 1 and metal layer 2 along border 4, with which formation of cracks 5 is effectively prevented even with a large number of cyclic temperature loads with extreme temperature differences.

Figure 2:
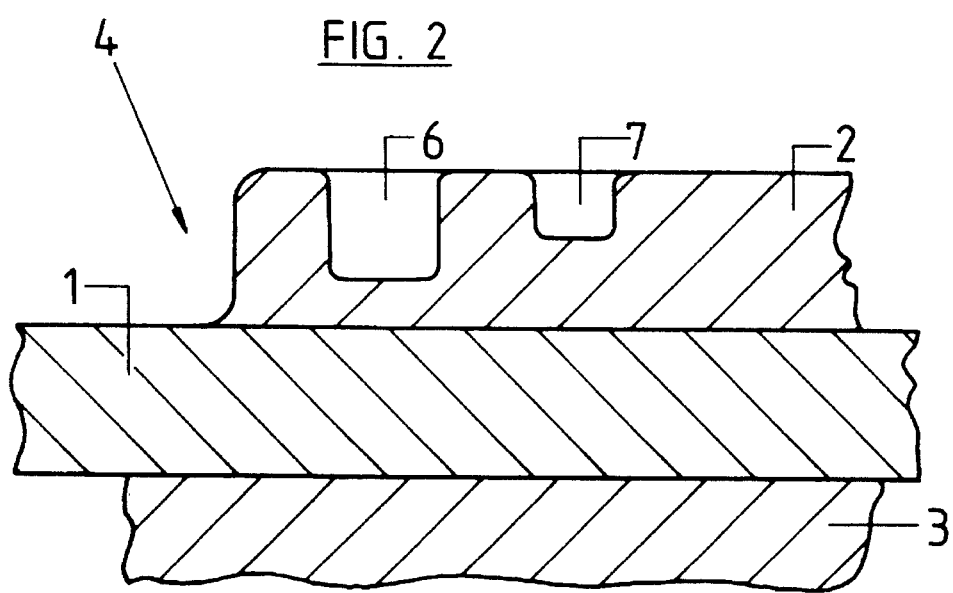
FIG. 2 shows a section corresponding to line I—I.

In the embodiment shown in FIG. 1 and 2 the openings 6 nearer border 4 have a cross section which is greater than the cross section of openings 7.

Figure 3:
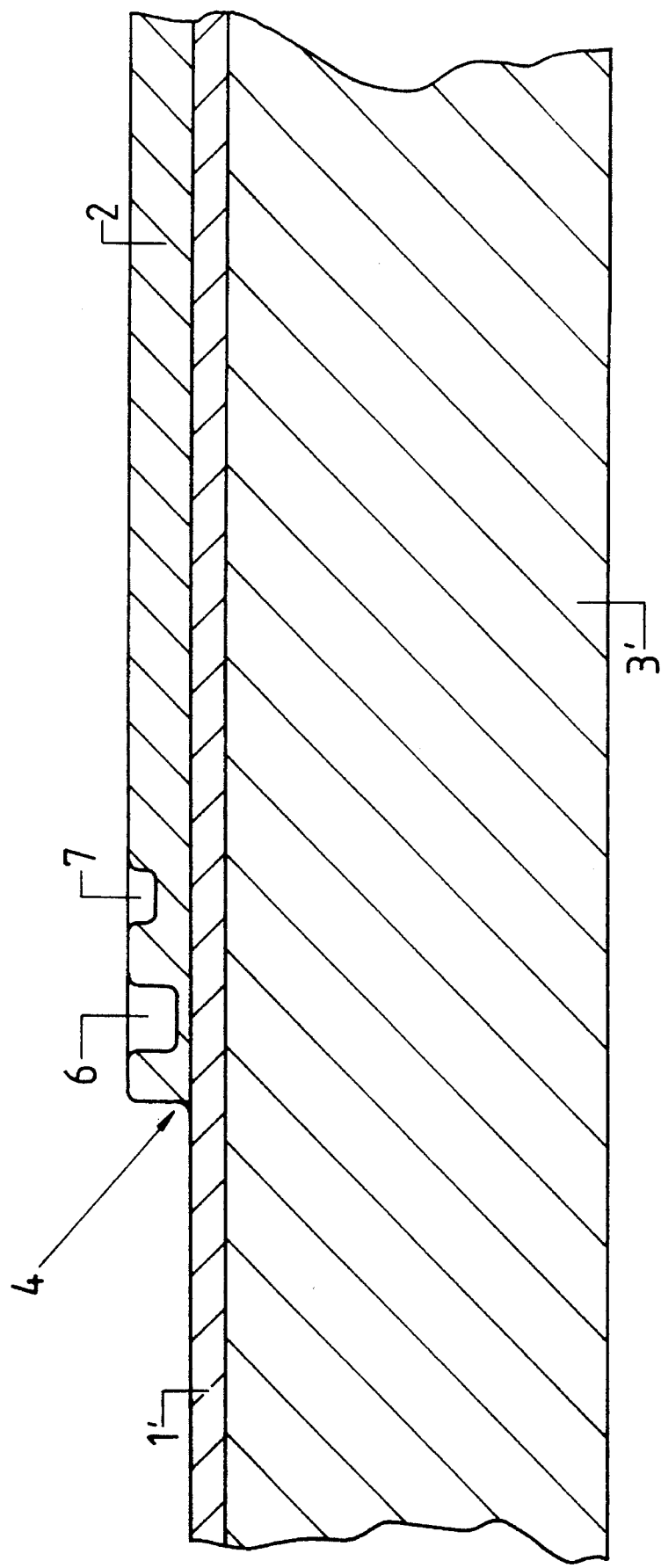
FIG. 3 shows in a representation like FIG. 2 a metal core plate.

FIG. 3 shows in a simplified representation and in a partial section another metal core plate which consists of top copper layer 3, insulating layer 1' made of a plastic material, for example, a plastic material ordinarily used for circuit boards (GFK circuit board material), with a thickness of roughly 20-10 microns and a thick metal layer or plate 3' which is made for example of aluminum. Copper layer 2' is in turn provided with openings 6 and 7 along the border.

The invention was described above on one example of an embodiment. It goes without saying that numerous changes and modifications are possible without departing from the inventive idea underlying the invention.

For example, it is possible that openings 6 and 7 in two rows, but also from row to row, each have different sizes or cross section and/or different depths, however the depth of openings 6 always being greater than the depth of the adjacent openings 7. Furthermore, it is also possible that opening 6 and/or 7 have a cross section which deviates from the circular shape.

In the aforementioned description it was assumed for the sake of simplicity that openings 6 and 7 are provided only on border 4 of metal layer 2. Of course the corresponding openings can also be provided on the border of metal layer 3.

In the embodiment shown in FIGS. 1 and 2 the rows formed by openings 6 and 7 are spaced from one another and the cross section of these openings is selected such that the rows of openings overlap.

| List of reference numbers | |
| --- | --- |
| 1 | Ceramic layer |
| 1' | Insulating layer |
| 2, 3 | Metal layer |
| 3' | Metal layer |
| 4 | Border |
| 5 | Crack |
| 6, 7 | Opening |

I claim:

1. A metal coated substrate with improved resistivity to cyclic temperature stress, comprising:

at least one metal layer (2, 3) attached flat to at least one surface of an insulating layer having a thickness of at least 0.2 mm, said at least one metal layer being disposed on at least one borders area (4), and being weakened by opening (6, 7) in said at least one metal layer, said openings being disposed in two rows in said at least one border area (4), a first one of said two rows nearer said at least one border area having a greater depth than a second one of said two rows farther from said at least one border area (4), wherein a distance between bottoms of said openings (6) in said first one of said two rows and said insulating layer is less than approximately one third of a thickness of said at least one metal layer (2), and a distance between bottoms of said second one (7) of said two rows of openings and said at least one surface of said insulating layer (1, 1') is approximately between one third and one half of said thickness of said at least one metal layer (2).

2. A metal coated substrate as recited in claim 1, wherein said two rows are spaced apart a maximum distance of 10 to 30 times the thickness of said at least one metal layer (2, 3), and a maximum of 2 mm from said at least one border area (4).

3. A metal coated substrate with improved resistivity to cyclic temperature stress, comprising:

at least one metal layer (2, 3) attached flat to at least one surface of an insulating layer having a thickness of at least 0.2 said at least one metal layer being disposes on at least one border area (4), and being weakened by opening (6, 7) in said at least one metal layer, said openings being disposed in two rows spaced a maximum of 2 mm from said border area (4), a first one of said two rows nearer said at least one border area having a greater depth than a second one of said two rows farther from said at least one border area (4), wherein a distance between bottoms of said openings (6) in said first one of said two rows and said insulating layer is less than approximately one third of a thickness of said at least one metal layer (2), and a distance between bottoms of said second one (7) of said two rows of openings and said at least one surface of said insulating layer (1, 1') is approximately between one third and one half of said thickness of said at least one metal layer (2).

4. A substrate according to claim 1, wherein said openings (6, 7) of said two rows have the same cross section.

5. A substrate according to claim 1, wherein said openings (6, 7) of said two rows have a different cross section.

6. A substrate according to claim 1, wherein said openings (6, 7) of said two rows are offset on gaps.

7. A substrate according to claim 1, wherein said insulating layer has a ceramic layer (1).

8. A substrate according to claim 1, wherein said insulating layers (1') includes a plastic material used to form circuit boards.

9. A substrate according to claim 1, wherein said insulating layers (1') includes plastic material and is joined flat with a metal carrier plate (3').

10. A substrate according to claim 1, wherein said openings have cross sections corresponding to approximately 5-3 times a thickness of said at least one metal layer (2).

* * * * *